United States Patent [19]
Carr et al.

[11] Patent Number: 6,052,073
[45] Date of Patent: Apr. 18, 2000

[54] SERIAL TO PARALLEL CONVERTER ENABLED BY MULTIPLEXED FLIP-FLOP COUNTERS

[75] Inventors: Larrie Carr, Burnaby; Winston Mok, Vancouver, both of Canada

[73] Assignee: PMC-Sierra Ltd.

[21] Appl. No.: 09/045,703

[22] Filed: Mar. 23, 1998

[51] Int. Cl.[7] .................................................. H03M 9/00
[52] U.S. Cl. ........................................ 341/100; 341/141
[58] Field of Search ............................. 341/81, 100, 101, 341/141; 365/219; 377/34; 714/809; 326/93

[56] References Cited

U.S. PATENT DOCUMENTS

| | | | |
|---|---|---|---|
| 4,408,336 | 10/1983 | DasGupta | 377/34 |
| 4,584,673 | 4/1986 | Kuijk | 365/219 |
| 5,249,186 | 9/1993 | Remson | 714/809 |
| 5,686,913 | 11/1997 | Coln et al. | 341/51 |
| 5,857,005 | 1/1999 | Buckenmeier | 326/93 X |
| 5,926,120 | 7/1999 | Swenson et al. | 341/100 |

*Primary Examiner*—Brian Young
*Assistant Examiner*—Patrick Wamsley
*Attorney, Agent, or Firm*—Pascal & Associates

[57] ABSTRACT

A serial to parallel converter comprising a serial shift register for receiving an incoming serial stream of bits, a parallel word latch for receiving in parallel bits stored by the shift register, when enabled by an enable signal at an enable time, and for providing a parallel data output signal, a controller for generating an enable signal at the enable time and applying the enable signal to the parallel word latch, the controller being comprised of a counter for counting input clock pulses at a serial bit rate and for providing the enable signal upon counting plural input clock pulses, the counter being comprised of active elements restricted to plural combination multiplexed flip/flops.

10 Claims, 9 Drawing Sheets

SERIAL TO PARALLEL CONVERTER ENABLED BY MULTIPLEXED FLIP-FLOP COUNTERS

FIELD OF THE INVENTION

This invention relates to the field of data transmission, and in particular to series to parallel and parallel to series data converters.

BACKGROUND TO THE INVENTION

A data transmission standard such as Bellcore Synchronous Optical Network (SONET) involves transmission of basic serial information in a serial bit stream with a basic bit rate of 51.840 Mbits/s. The data is typically converted from serial to parallel data format, wherein the parallel data clock rate is a fraction of the serial data clock rate, and is converted from parallel to serial data format, at various parts of the system carrying and translating the data.

It is desirable to use integrated circuits to provide the conversion. The result of a serial-to-parallel conversion allows other logic circuits on the integrated circuit to process the data at the slower parallel clock rate. The need for the parallel-to-serial conversion is that the result of that data processing usually is transmitted using the same serial format. Both circuits operate mainly on the serial clock rate thus requiring custom design since standard logic libraries are usually not capable of the serial clock speeds.

While the function of a particular design may not change over its lifetime, integrated circuit technology used to fabricate the designed structure can change over the lifetime of the design. As new integrated circuit technology becomes available, the custom logic must be maintained, which is a very expensive engineering activity.

SUMMARY OF THE INVENTION

The present invention relates to converters which use only a single type of active element, a combination multiplexed flip/flop. As a result, with change in the integrated circuit technology which may be used to realize the invention, the form of only a single type of active element need be re-engineered, saving significant cost.

Special circuitry has been utilized to delay modification of a parallel word by further incoming serial bits for a time period sufficient to ensure that the parallel word is output from the converter, while ensuring that incoming serial bits during that time period are not lost.

In accordance with an embodiment of the invention, a serial to parallel converter comprises: (a) a serial shift register for receiving an incoming serial stream of bits, (b) a parallel word latch for receiving the parallel bits stored by the shift register, when enabled by an enable signal at an enable time, and for providing a parallel data output signal, and (c) a controller for generating an enable signal at the enable time and applying the enable signal to the parallel word latch, (d) the controller being comprised of a counter for counting input clock pulses at a serial bit rate and for providing the enable signal upon counting plural input clock pulses, the counter being comprised of active elements restricted to a plural combination multiplexed flip/flops each having the capacity of performing a boolean function of two binary bits.

In accordance with another embodiment of the invention, the embodiment described above is modified to include a circuit for stopping storage of an incoming serial bit by the shift register during a bit period when the parallel data output signal is being provided to the parallel word latch, and for storing that incoming serial bit in a register during the bit period, and a circuit for providing the stored serial bit to the parallel word latch at the correct bit position relative to other bits received by the parallel word latch.

In accordance with another embodiment of the invention, a parallel to serial converter comprises (a) a parallel word latch for receiving a series of words comprised of parallel data words, (b) a shift register for receiving the parallel data words and for storing bits of a parallel data word in a series of shift register stages upon receipt of a first enable signal, and for providing a serial stream of bits at a serial clock rate, (c) a circuit for receiving a serial clock signal and for providing the serial clock signal to the shift register to enable shifting of the stored bits to output as the serial stream of bits, and (d) a controller for generating the enable signal and for applying the enable signal to the shift register and parallel word latch, (e) the controller being comprised of a counter for counting input clock pulses at a serial bit rate and for providing the enable signal upon counting plural clock pulses, the counter being comprised of active elements restricted to plural combination multiplexed flip/flops each having the capacity of performing a boolean function of two binary bits.

BRIEF INTRODUCTION TO THE DRAWINGS

A better understanding of the invention will be obtained by considering the detailed description below, with reference to the following drawings, in which:

FIG. 1 is a schematic diagram of a multiplexed flip/flop combination, forming a basic active building block of the invention, FIG. 2 is a schematic diagram of a shift register which can be used in any of the embodiments of the invention, FIG. 3A is the first half of a schematic diagram of an embodiment of the invention, FIG. 3B is the second half of a schematic diagram of an embodiment of the invention, FIG. 4A is the first half of a schematic diagram of a modification of the embodiment of FIG. 1.

FIG. 4B is the second half of a schematic diagram of a modification of the embodiment of FIG. 1, FIG. 5A is the first half of a schematic diagram of a parallel-to-serial converter of the invention, FIG. 5B is the second half of a schematic diagram of a parallel-to-serial converter of the invention, and FIG. 6A is the first half of a schematic diagram of a parallel-to-serial converter, FIG. 6B is the second half of another embodiment of a parallel-to-serial converter.

DETAILED DESCRIPTION OF EMBODIMENTS OF THE INVENTION

Figure 1:
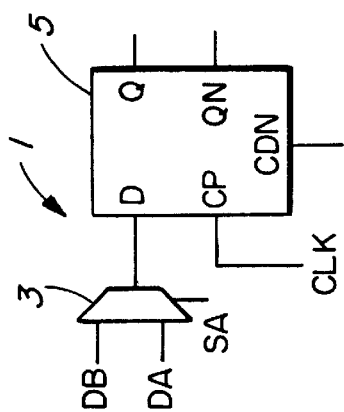

Turning to FIG. 1, the basic active building block used in an embodiment of the present invention is a multiplexed flip/flop element 1. The element is logically comprised of a multiplexer 3 having two signal inputs DA and DB and a control input SA, and an output which is connected to the data input D of a D-type flip flop 5. Flip flop 5 has outputs Q and QN, a clock input CP and a reset input CDN. In another design a suitable larger form of multiplexer could be used.

On the rising edge of a pulse signal on the clock input CP, the flip flop 5 transfers and applies and holds the binary logic value applied to its input D by the multiplexer 3, at its output Q. It also holds the inverse value on the flip flop output QN. The multiplexer 3 selects between two data values applied to inputs DA and DB, depending on the logic value applied to control input SA. When SA is logical 1, the input DA is selected, and when SA is 0, the input DB is logical selected. The flip flop asynchronous clear or reset input CDN resets the flip flop Q output to logic 0 and the QN output to logic 1, when CDN is logic 0.

This element 1 can determine a logic function of two boolean values in one high-speed clock cycle.

Figure 2:
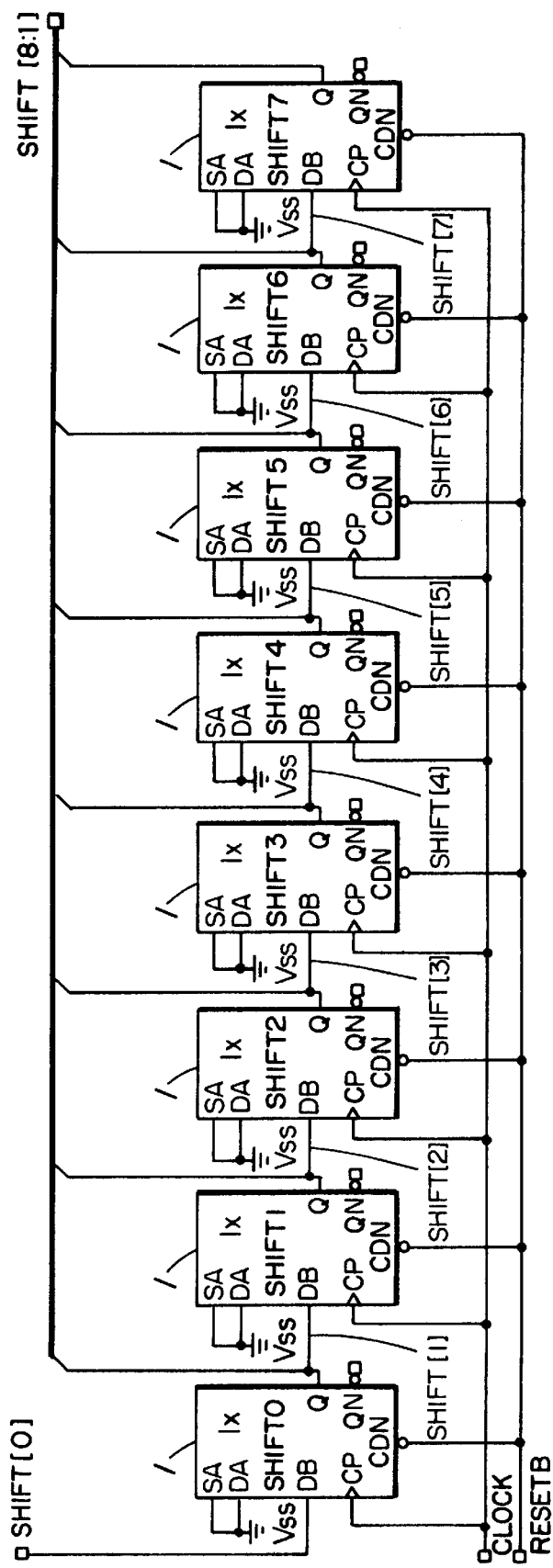

FIG. 2 illustrates a shift register formed by a plurality of elements 1 of FIG. 1. The Q outputs of each of a plurality of multiplexed flip/flop elements 1 (except for the last element 1 labelled SHIFT 7), are respectively connected to the DB inputs of successive multiplexed flip/flop elements 1 of a series of elements 1. While eight elements 1 are shown, other numbers can be used to create a different length of shift register. As a practical matter a count of four check pulses would be the minimum useful count value. A serial clock input CLOCK is applied to the CP inputs of each of the elements 1, and a reset signal RESETB signal input is connected to each of the CDN inputs of the elements 1.

The incoming serial data signal SHIFT [0] is applied to the DB input of the first element 1 of the series of elements 1. A parallel data signal is obtained from the Q outputs of the elements 1.

Operation of the shift register will become evident from the description below.

Figure 3A:
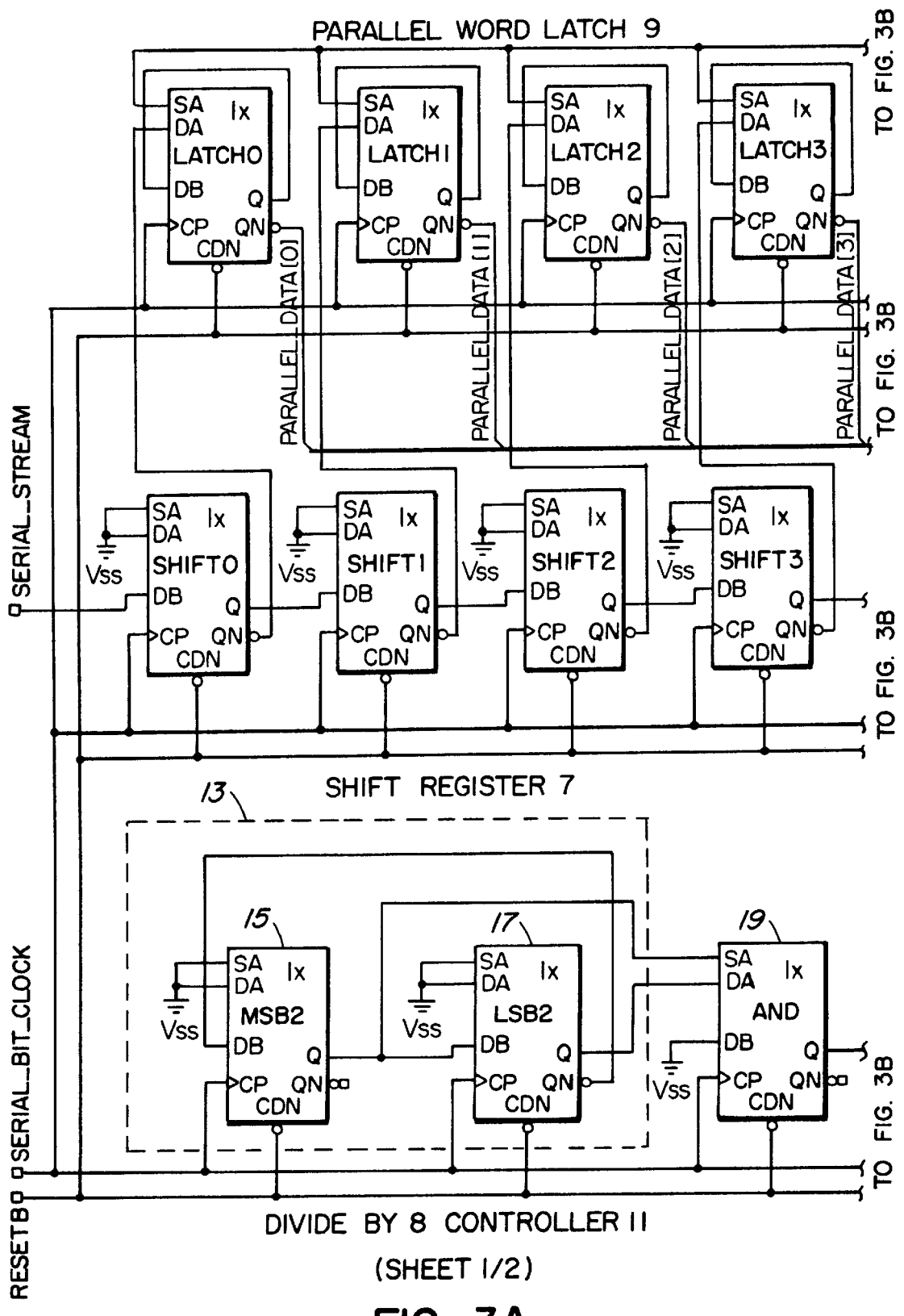
Figure 3B:
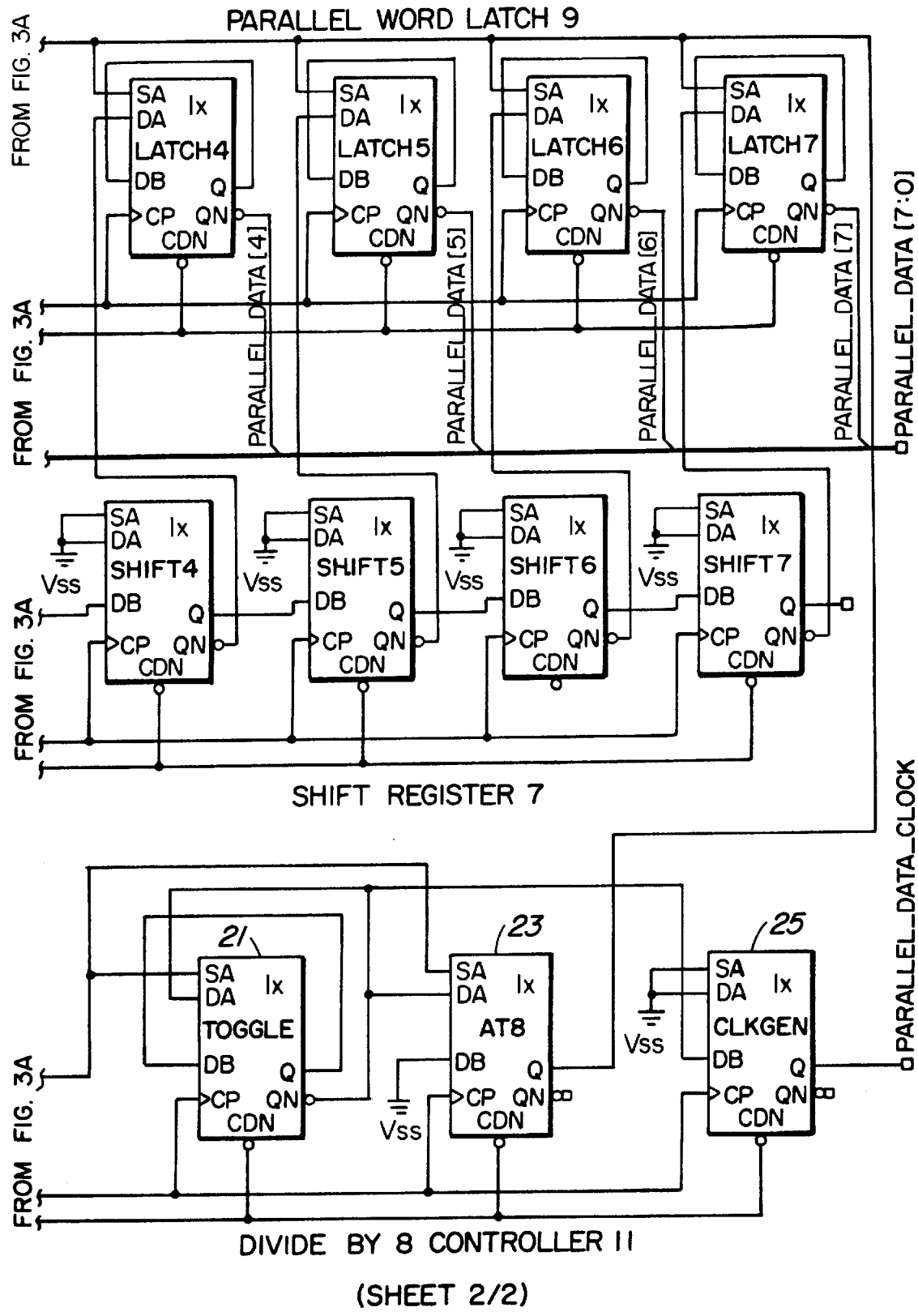

Turning to FIGS. 3A and 3B, a serial to parallel converter in accordance with an embodiment of the present invention is shown. The structure is comprised of a shift register 7, a parallel word latch 9, and a divide-by-8 controller 11. The shift register is a structure as described earlier with respect to FIG. 2, wherein the serial data stream is applied to the DB input of the first element as described above.

The QN output of each stage of the shift register 7 is connected to the DA input of the corresponding stage of the parallel word latch 9. The parallel word latch 9 is formed of plural single bit elements 1, which receive respective single bits of the parallel word output from respective stages of shift register 7 at their inputs DA and output parallel bits at their respective outputs QN on an output bus PARALLEL DATA. The Q output of each element of the parallel word latch 9 is connected to its input DB.

Thus each element (stage) of the shift register 7 accepts data from a preceding stage. On each rising edge of the serial clock, a single bit of data in the input serial bit stream is captured by the first stage in the shift register while the other captured data bits in the shift register are shifted to the next adjacent stage. When the shift register is full (e.g. after 8 rising edges of the serial clock), the parallel word latch 9 latches a copy of the data in the shift register 7 (via the QN outputs of the shift register connection to the DA inputs of the parallel word latch) to allow downstream logic to process the parallel data word.

The controller 11 is required to count the rising edges of the serial clock, and provide an enable signal to the parallel word latch to cause it to accept the parallel data from the shift register at the appropriate time.

However, it will be recognized that counting 8 rising edges requires a 3 bit binary word (a count from $000_2$ to $111_2$), while the element 1 can only perform a logic function on two boolean values. In order to overcome this limitation, and still allow the elements as described earlier to provide the required count, a controller circuit as shown in FIGS. 3A and 3B is used.

A 2-bit gray code counter 13 is comprised of a most significant bit element MSB2 15 having its Q output connected to the DB input of a least significant bit element LSB2 17 which has its QN output connected to the DB input of element MSB2. The CP inputs are connected to receive a serial bit clock and the CDN inputs are connected to the RESETB input, as are all of the elements of the controller. The SA and DA inputs of elements 15 and 17 are connected to ground (Vss).

The Q outputs of the elements 15 and 17 are connected to the SA and DA inputs of another element 19, which performs a boolean AND function.

The Q output of element 19 is connected to the SA input of a TOGGLE element 21 and to the SA input of another element 23 labeled AT8. The Q output of element 21 is connected to its DB input as well as to the DA input of element 23, and the QN output of element 21 is connected to its DA input as well as to the DB input of another element 25. The DB inputs of elements 19 and 23 and the SA and DA inputs of element 25 are connected to Vss. The Q output of element 25 provides a parallel data clock signal at the parallel clock rate.

All of the active elements of shift register 7, parallel word latch 9 and 15, 17, 19, 21, 23 and 25 are similar to the element 1 described with reference to FIG. 1.

In operation, the MSB2 and LSB2 flip flops implement a 2-bit gray code counter of the serial clock pulses applied to their CP inputs, and perform a divide-by-4 function on the serial clock pulses. Whenever the two Q outputs of elements 15 and 17 are 1, i.e. the bit count is $11_2$, the output of the AND element 19 goes to high logic level for 1 clock cycle. When the AND element output is high, the TOGGLE element 21 "toggles" to its opposite values, performing a divide-by-2 function. Thus the output of the TOGGLE element 21 is a clock signal with a frequency which is 8 times slower than that of the serial bit clock.

The AT8 element 23 detects when a count of 8 has been achieved (i.e. the gray code counter elements 15 and 17 are equal to $11_2$ and the TOGGLE element is equal to $1_2$) and applies an enable signal to the parallel word latch 9 elements, to capture the shift register values stored in the shift register stages.

The CLKGEN element 25 delays the clock signal from the TOGGLE element 21 in order that the outgoing parallel data clock should change value at the same time as the parallel word which is output from parallel word latch 9 changes.

Figure 4A:
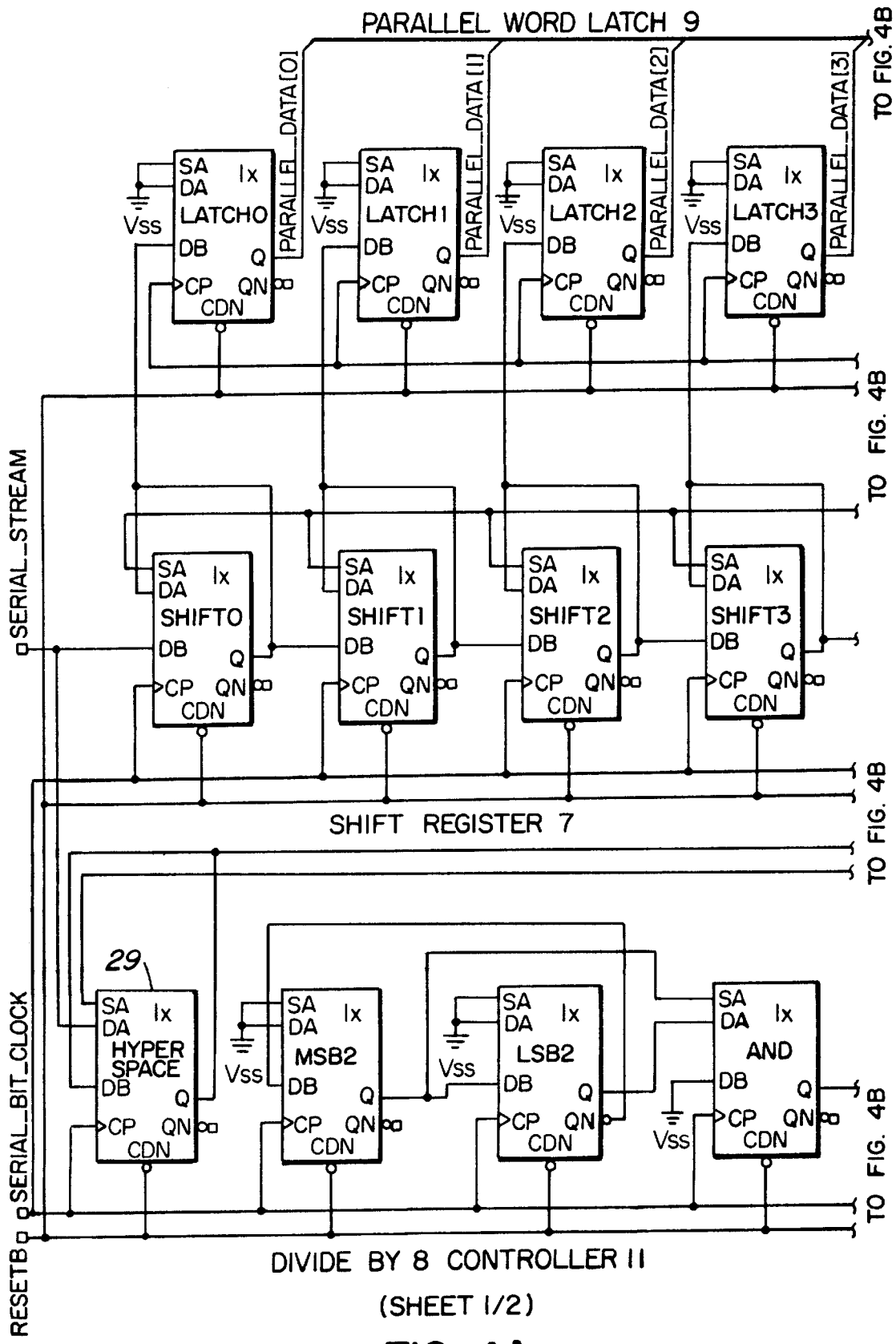
Figure 4B:
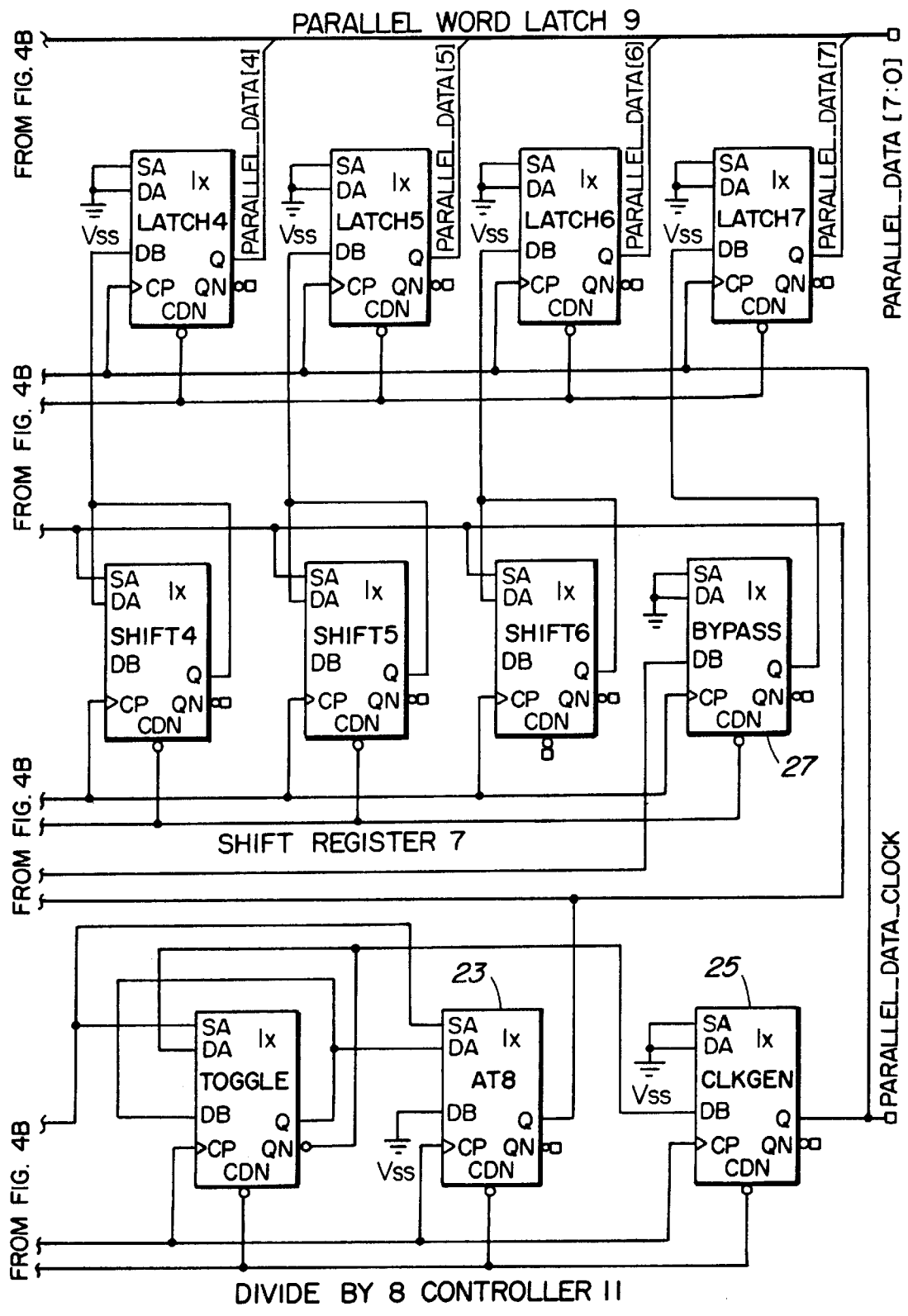

FIGS. 4A and 4B illustrates another embodiment of a serial to parallel converter. This structure allows the parallel word latch to operate at the parallel data clock rate rather than at the high speed serial clock rate, saving considerable supply power.

The controller 11, latch 9 and shift register 7 are similar to those described with respect to the embodiment of FIGS. 3A and 3B. However, instead of the clock input CP of parallel word latch 9 being driven by the serial bit clock line, it is driven by the output of the CLKGEN element 25, which is the parallel data clock.

The SA and DA inputs of each stage of latch element 9 are connected to Vss. The second to eighth data inputs DB of latch element 9 are connected to the Q outputs of the last 7 stages of shift register 7. The first data input DB of latch element 9 is connected to the Q output of another element 27 (which is an element similar to element 1 described earlier). The clock CP and reset CDN inputs of element 27 receive the serial clock and reset signals from the SERIAL BIT CLOCK and RESETB inputs described earlier.

The serial input signal is applied in parallel to the DB input of the shift register 7, as in the embodiment of FIGS. 3A and 3B, and to the DA input of another element 29, labeled HYPERSPACE, which is similar to element 1. The Q output of element 29 is connected to the DB input of element 27, and as well is fed back to its DB input. The outputs of the shift register 7 are connected to the respective DA inputs as described earlier with respect to FIG. 2.

The shift control inputs SA of elements 29 and 7 are connected to the Q output of AT8 element 23. Since the output of the AT8 element pulses at the parallel clock rate, element 29 is enabled to capture a serial bit at the time of the rising edge of the parallel clock, and at the same time the shift register is controlled to ignore that bit, feeding back to the same stages the same bits to its outputs as already appear at their outputs. Thus whenever a parallel clock rising edge appears, the shift register in effect pauses shifting in an incoming bit and thus ignores the incoming bit, but the incoming bit is shifted into HYPERSPACE element 29, and the incoming bit is then transferred to BYPASS element 27.

When the latch 9 is enabled, at the next parallel clock rising edge output from CLKGEN element 25, to receive the parallel data, it receives the bit stored by element 27 as the first bit, and the remaining bits stored by shift register 7, at its inputs DB. The complete parallel data word is thus reconstructed in latch 9 and is output as parallel data on the PARALLEL DATA line.

This structure has the advantage that it avoids the requirement that is present in the structure of FIGS. 3A and 3B that the parallel data latch must grab the valid data during only one serial bit clock period, since the parallel data from the shift register is valid for only one serial bit clock period. In the present embodiment, the data from the serial shift register is valid for two serial clock pulses instead of only one serial clock pulse, and this allows use of a slower clock for the parallel latch, and solves the problem of the slower clock not being aligned to the high-speed clock due to propagation time through element 25. Using the lower frequency clock for the parallel data latch also saves significant supply power.

Figure 5A:
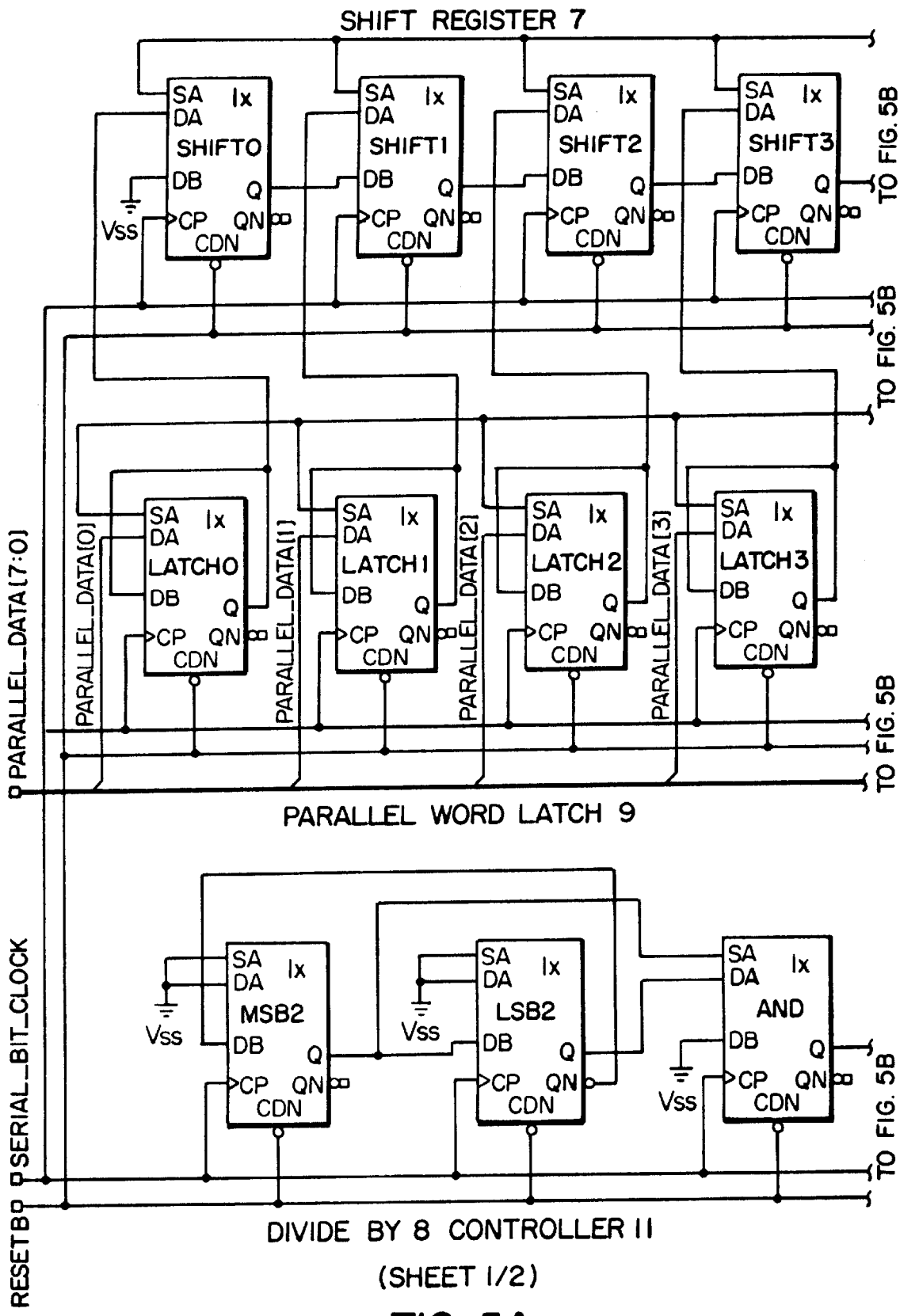
Figure 5B:
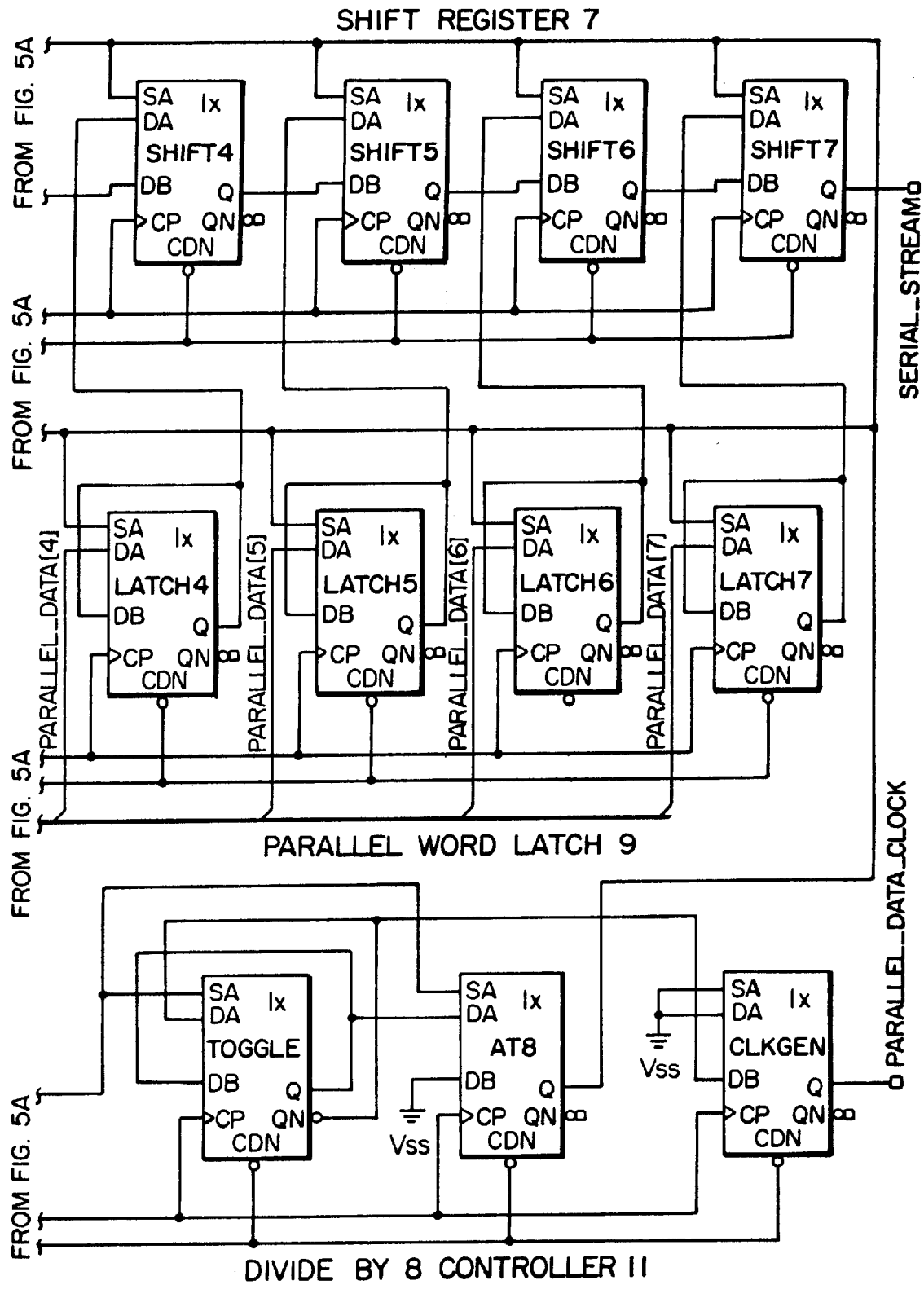

An embodiment of a parallel to serial converter is illustrated in FIGS. 5A and 5B. The controller 11, the shift register 7 and the parallel word latch 9 are similar to those described with reference to FIGS. 3A and 3B. The clock CP and reset CDN inputs thereof are connected to receive the serial clock and reset signal as described earlier.

However, in this case the incoming signal is comprised of parallel data, which is applied to the DA inputs of parallel word latch 9. The outputs of the latch are connected to its inputs DB as well as to the parallel inputs of shift register 7. The shift control inputs of latch 9 and shift register 7 are connected to the Q output of AT8 element 23, to receive input shift control pulses at the parallel clock rate. The Q output of the last stage of the shift register 7 is connected to the SERIAL STREAM output line, for delivering a serial stream of data corresponding to the parallel data that is input to latch 9.

In operation, at the parallel clock rate data is input to parallel word latch 9, where it is latched. At that same rate, the parallel data from the Q outputs of latch 9 is applied in parallel to each stage of the shift register 7. This is shifted at the serial clock rate out of shift register 7 to the output line SERIAL STREAM.

More particularly, during a rising edge of the serial bit clock, the shift register 7 outputs a bit of the data stored in the shift register, to the serial bit stream. When the shift register 7 is shifting out the last bit of data stored in it, it loads a new data word from the parallel word latch 9. As well, the parallel word latch 9 also loads a new data word received from upstream circuitry at the same time.

The controller 11 counts to 8, as in the serial to parallel converter described earlier, except that it is used to determine when the shift register and parallel word latch should store new values. The parallel clock signal derived by the controller can be used by upstream circuitry to control when parallel data is to be fed to the parallel data input of the word latch 9.

Figure 6A:
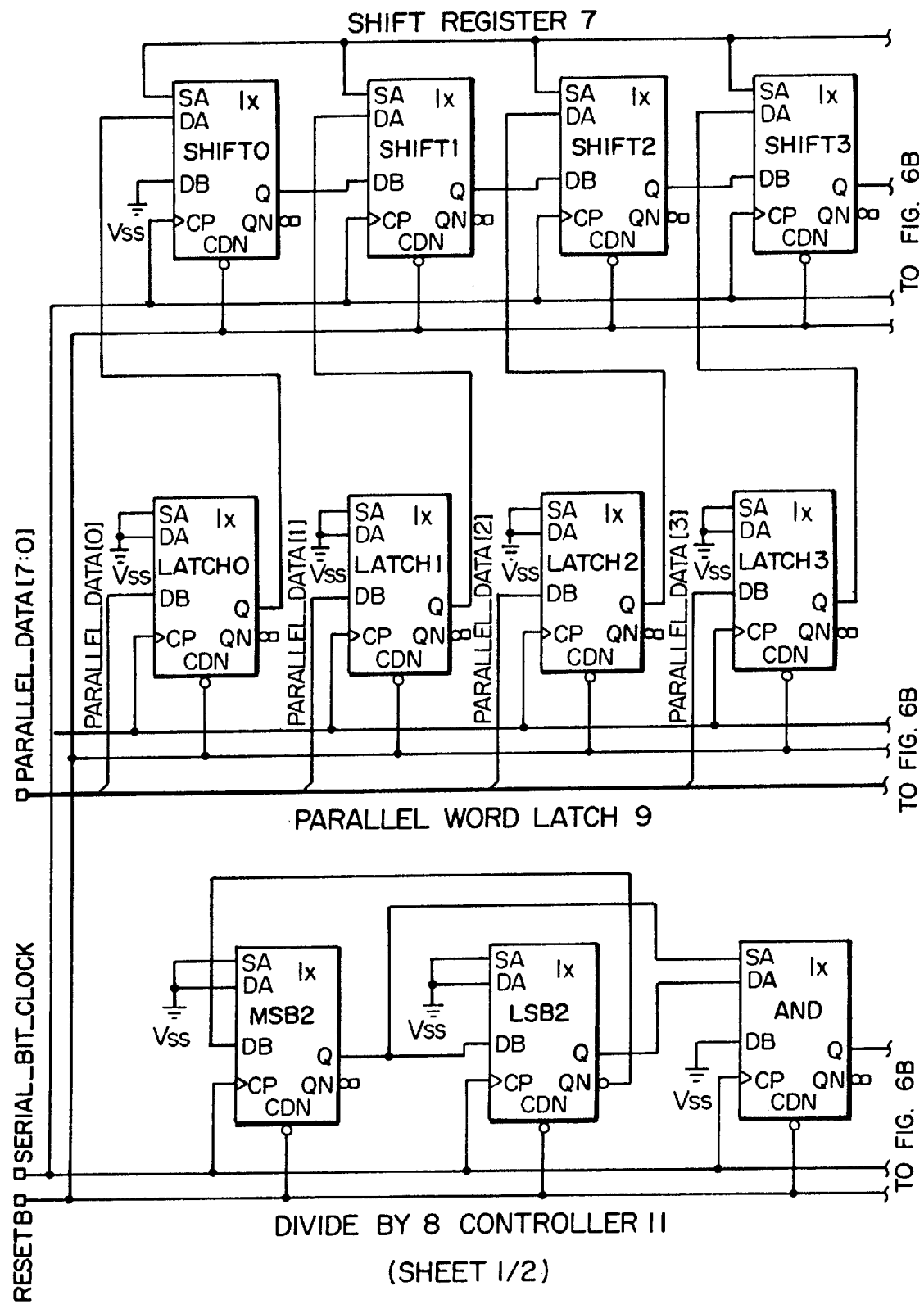
Figure 6B:
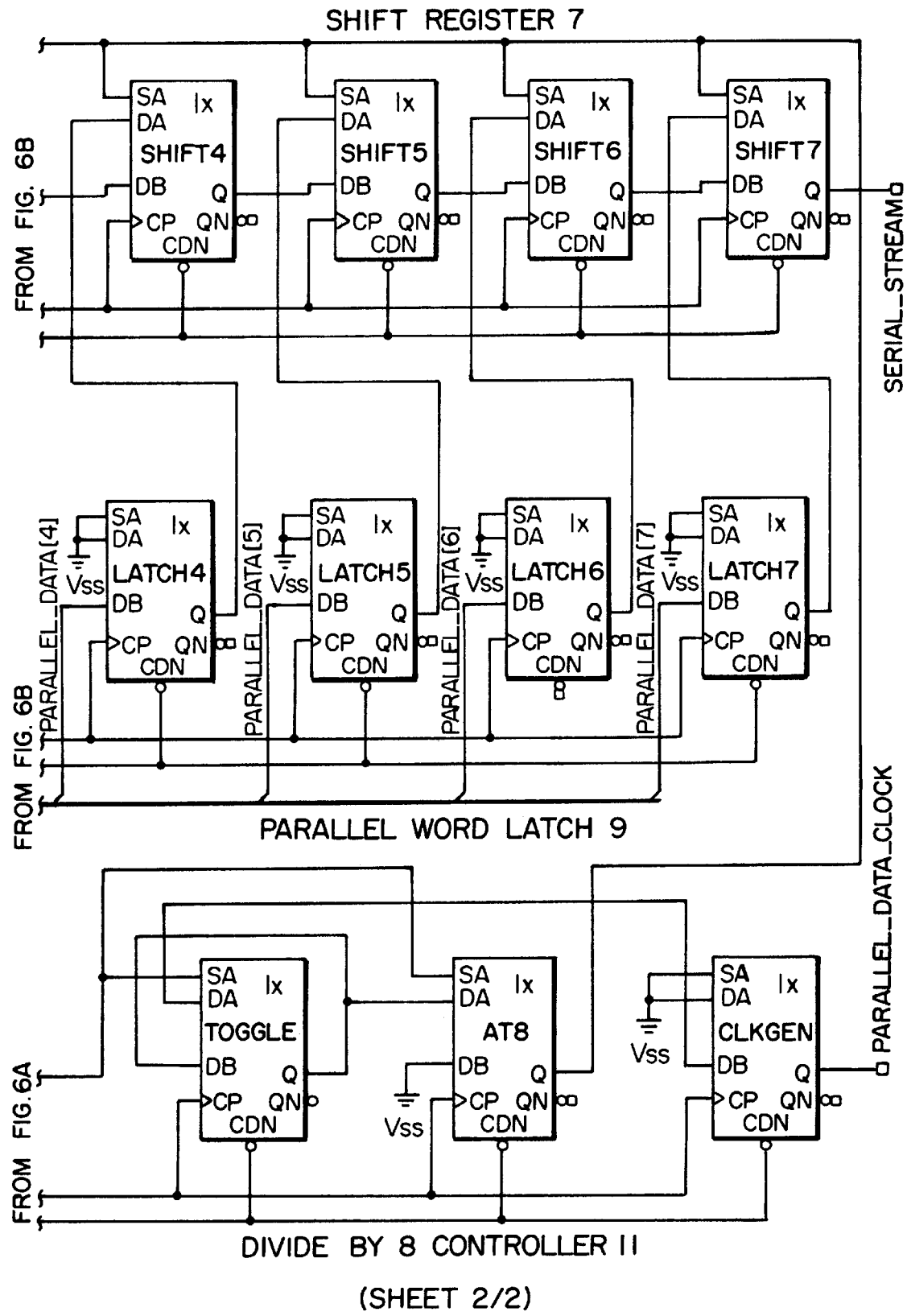
Figure 4B:
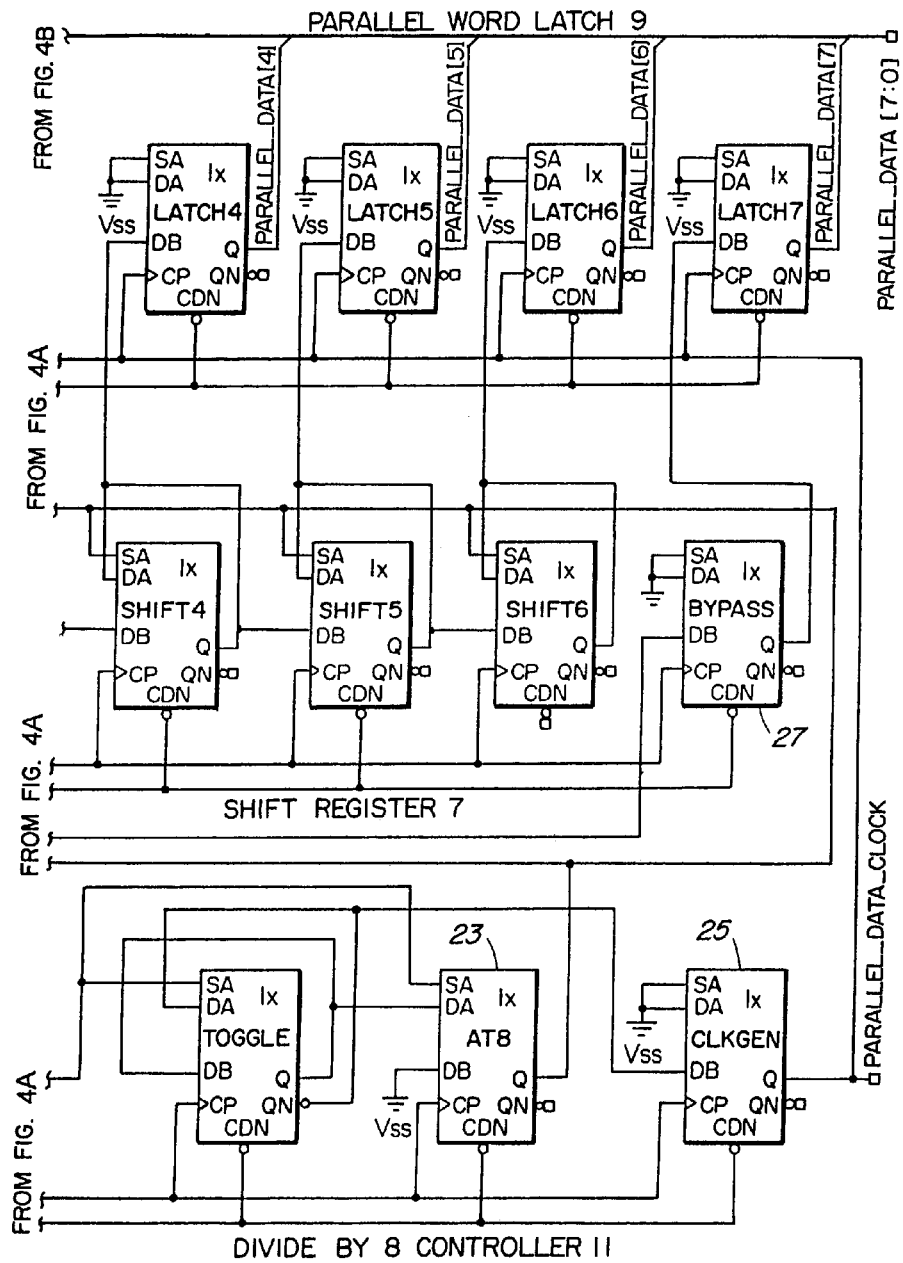
Figure 6B:
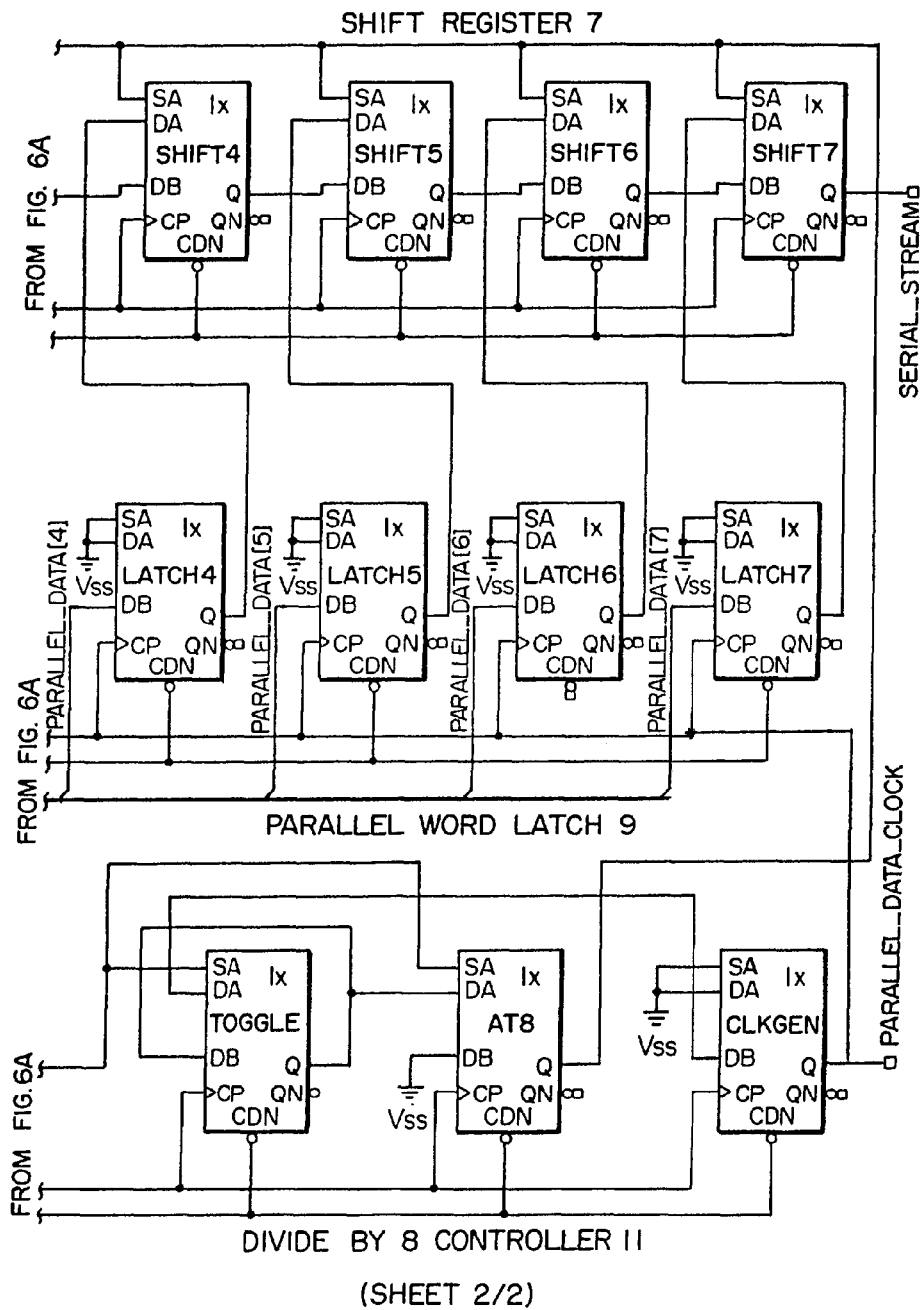

FIG. 6 is a diagram which shows a parallel-to-serial converter, with the parallel word latch 9 operating on the slower parallel clock. As with the serial-to-parallel converter, less power is required to operate the latch 9.

The length of the shift register can be different from the 8 stages described herein, depending on the application. In such case, the design of the controller would be changed to trigger the movement of data between the shift register and the parallel word latch after the required count has been reached, e.g. two bits, three bits, four bits, 16 bits, etc.

The embodiments above thus are achieved using only a single form of active element, which allows only relatively simple engineering design changes, relating to the construction of only a single form of integrated circuit element, with variation in integrated circuit processes. In addition, an improvement in the circuitry for a serial to parallel converter which save significant supply power has been achieved.

A person understanding this invention may now conceive of alternative structures and embodiments or variations of the above. All those which fall within the scope of the claims appended hereto are considered to be part of the present invention.

We claim:

1. A serial to parallel converter comprising:
   (a) a serial shift register for receiving an incoming serial stream of bits,
   (b) a parallel word latch for receiving in parallel bits stored by the shift register, when enabled by an enable signal at an enable time, and for providing a parallel data output signal,
   (c) a controller for generating said enable signal at the enable time and applying the enable signal to the parallel word latch, said controller being comprised of a counter for counting input clock pulses at a serial bit rate and for providing the enable signal upon counting plural input clock pulses, the counter being comprised of active elements restricted to plural combination multiplexed flip/flops.

2. A counter as defined in claim 1 in which the counter includes a circuit for providing the enable signal upon counting a number of input clock pulses equal to the length of the serial shift register.

3. A counter as defined in claim 2 in which the counter is comprised of a two-bit gray code counter having its output connected to a multiplexed flip/flop forming an AND gate for providing a predetermined logic output signal when a count signal output from the gray code counter is $11_2$, and a multiplexed flip/flop forming a toggle for receiving an output signal from the AND gate, toggling to divide the output signal from the AND gate by two, and providing a resulting signal to a further multiplexed flip/flop for generating the enable signal therefrom.

4. A counter as defined in claim 3 including an additional multiplexed flip/flop for receiving the signal from the toggle and for providing a parallel data clock signal at a parallel data clock rate.

5. A counter as defined in claim 1 including a circuit for stopping storage of an incoming serial bit by the shift register during a bit period when the parallel data output signal is being provided by the parallel word latch, and for storing said incoming serial bit in a register during said bit period, and a circuit for providing said stored serial bit to the parallel word latch at a correct bit position relative to other bits received by the parallel word latch.

6. A serial to parallel converter comprising:

(a) a serial shift register for receiving an incoming serial stream of bits, (b) a parallel word latch for receiving in parallel bits stored by the shift register, when enabled by an enable signal at an enable time, and for providing a parallel data output signal, (c) a controller for generating said enable signal at the enable time and applying the enable signal to the parallel word latch, said controller being comprised of a counter for counting input clock pulses at a serial bit rate and for providing the enable signal upon counting plural input clock pulses, the counter being comprised of active elements restricted to plural combination multiplexed flip/flops, in which all of the active elements of the converter are comprised of combination multiplexed flip/flops.

7. A serial to parallel converter comprising:

(a) a serial shift register for receiving an incoming serial stream of bits, (b) a parallel word latch for receiving in parallel bits stored by the shift register, when enabled by an enable signal at an enable time, and for providing a parallel data output signal, (c) a controller for generating said enable signal at the enable time and applying the enable signal to the parallel word latch, said controller being comprised of a counter for counting input clock pulses at a serial bit rate and for providing the enable signal upon counting plural input clock pulses, the counter being comprised of active elements restricted to plural combination multiplexed flip/flops.

in which each of the active elements is comprised of data inputs DA and DB, complementary outputs Q and QN, a shift control input SA for determining which of the inputs DA or DB supplies data to the output Q, and a clock input CP, the controller is comprised of a first and second active elements each having a clock input connected to a source of the input clock pulses, the second active element having a DB input connected to the Q output of the first active element, the QN output of the second active element connected to the DB input of the first active element, a third active element having a DA input connected to the Q output of the second active element and having an SA input connected to the Q output of the first active element, a fourth active element having an SA input connected to the Q output of the third active element, the QN output of the fourth active element connected to the DA input of the fourth active element and the Q output of the fourth active element connected to the DB input of the fourth active element, a fifth active element having its SA input connected to the Q output of the third active element and having a DA input connected to the Q output of the fourth active element, the clock inputs of the third, fourth and fifth active elements being connected to the source of the serial clock pulses, and Q output of the fifth active element providing the enable signal.

8. A converter as defined in claim 7, in which the parallel word latch is comprised of plural parallel active elements, each having a DA input connected to the output of a corresponding stage of the shift register, each having an SA input connected to the Q output of the fifth active element, and the Q outputs of the parallel word latch being connected to corresponding DB inputs of each of the plural parallel active elements.

9. A converter as defined in claim 8, including a sixth active element having a DB input connected to the Q output of the third active element, having a clock input connected to receive the input clock pulses, and having a Q output for providing a parallel data clock output signal.

10. A converter as defined in claim 7, including a sixth active element having a DB input connected to the Q output of the third active element, having a clock input connected to receive the input clock pulses, and having a Q output for providing a parallel data clock output signal, and further including a seventh active element having a DA input to which the incoming serial stream of bits are applied and having its Q output connected to its DB input, and an eighth active element having a DB input connected to the Q output of the seventh active element, the seventh and eighth active elements having clock inputs connected to receive the input clock pulses, the SA input of the seventh active element and the SA inputs of the active elements of each of the stages of the shift register being connected to the Q output of the fifth active element, the Q output of the eighth active element being connected to the DB input of a first one of the parallel active elements of the parallel word latch and the outputs of each of the second to the last stages of the shift register being connected to the respective DB inputs of the parallel word latch, the Q output of the sixth active element being connected to the clock input of the each element of the parallel word latch.

* * * * *

UNITED STATES PATENT AND TRADEMARK OFFICE
CERTIFICATE OF CORRECTION

PATENT NO. : 6,052,073
DATED : April 18, 2000
INVENTOR(S) : Carr et al.

It is certified that error appears in the above-identified patent and that said Letters Patent is hereby corrected as shown below:

Drawings,
Delete drawing sheets 5 & 9, and substitute therefor drawing sheets 5 & 9 consisting of figures 4B and 6B, as shown on the attached pages.

Signed and Sealed this

Fifteenth Day of October, 2002

Attest:

JAMES E. ROGAN
Attesting Officer   Director of the United States Patent and Trademark Office